(12) United States Patent
Hirabayashi

(10) Patent No.: US 6,914,500 B2
(45) Date of Patent: Jul. 5, 2005

(54) FILTER CIRCUIT DEVICE AND METHOD OF MANUFACTURING THE SAME

(75) Inventor: Takayuki Hirabayashi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/468,874

(22) PCT Filed: Dec. 12, 2002

(86) PCT No.: PCT/JP02/13031

§ 371 (c)(1),
(2), (4) Date: Aug. 22, 2003

(87) PCT Pub. No.: WO03/056654

PCT Pub. Date: Jul. 10, 2003

(65) Prior Publication Data

US 2004/0085164 A1 May 6, 2004

(30) Foreign Application Priority Data

Dec. 27, 2001 (JP) .................................... P2001-397677

(51) Int. Cl.$^7$ ............................................. H01P 1/203
(52) U.S. Cl. ...................................... 333/204; 333/247
(58) Field of Search .............................. 333/184, 185, 333/204, 205, 246, 247; 156/89.12

(56) References Cited

U.S. PATENT DOCUMENTS

| 5,892,415 A | * | 4/1999 | Okamura ..................... 333/175 |
| 2002/0075106 A1 | * | 6/2002 | Okubora et al. ............ 333/247 |
| 2003/0141948 A1 | * | 7/2003 | Maekawa et al. ........... 333/204 |

FOREIGN PATENT DOCUMENTS

| JP | 11-191702 A | 7/1999 |
| JP | 2001-189605 A | 7/2001 |

* cited by examiner

*Primary Examiner*—Seungsook Ham
(74) *Attorney, Agent, or Firm*—Robert J. Depke; Trexler, Bushnell, Giangiorgi, Blackstone & Marr, Ltd.

(57) ABSTRACT

This invention is a filter circuit having a filter element. A filter element (4) is a parallel resonator circuit including a pair of first resonator lines (19a) (19b) formed by a thick film forming technique and a pair of second resonator lines (20a) (20b). As the thickness of the pair of second resonator lines (20a) (20b) is significantly reduced, the impedance ratio between the pair of second resonator lines (20a) (20b) and the pair of first resonator lines (19a) (19b) is increased. Therefore, the length of these pairs of resonator lines (19a) (19b) (20a) (20b) is reduced and miniaturization of the filter element is realized.

4 Claims, 15 Drawing Sheets

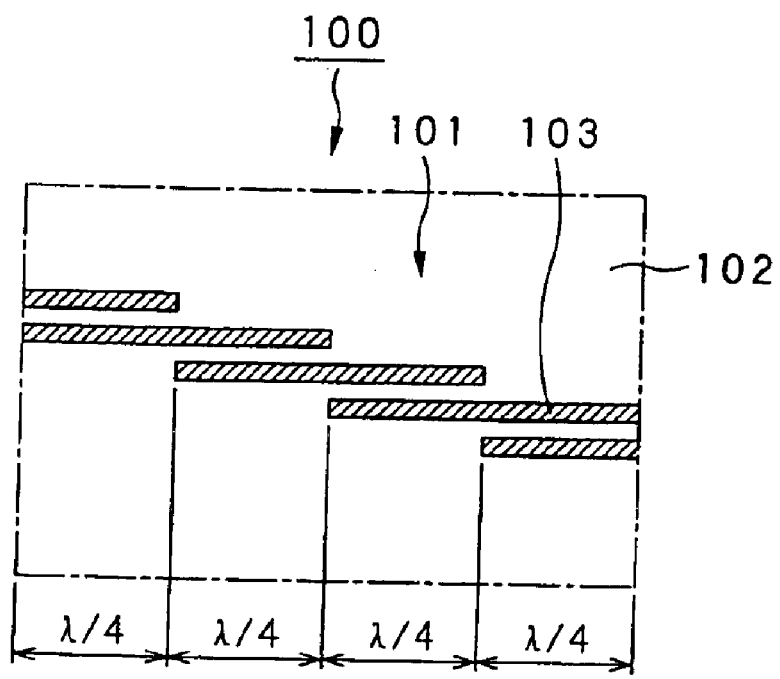
PRIOR ART FIG. 1
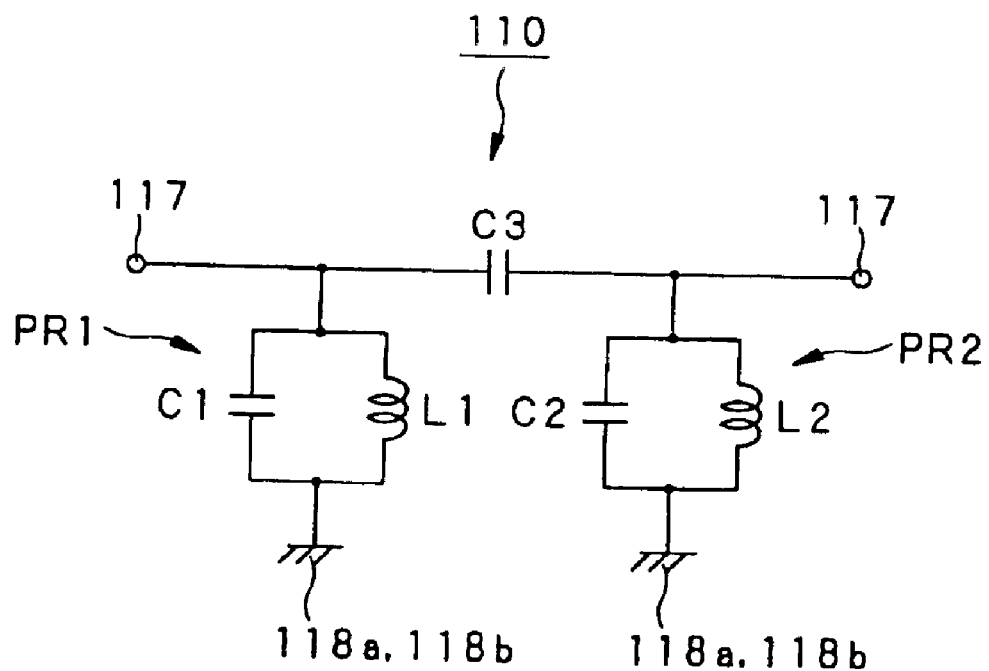
PRIOR ART FIG. 3

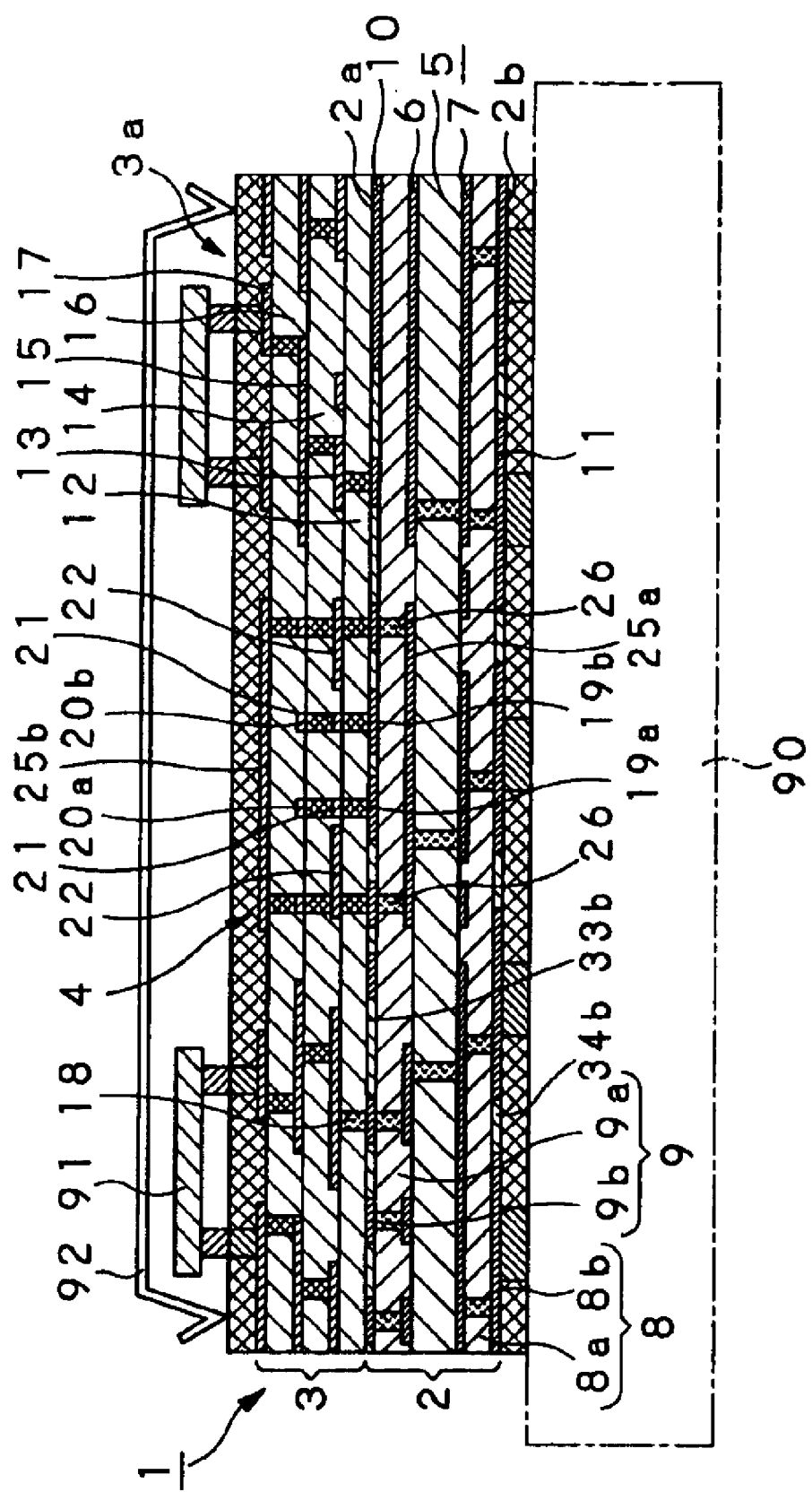

FILTER CIRCUIT DEVICE AND METHOD OF MANUFACTURING THE SAME

TECHNICAL FIELD

This invention relates to a filter circuit device having a filter element and a method for manufacturing the same.

This application claims priority of Japanese Patent Application No.2001-397677, filed on Dec. 27, 2001, the entirety of which is incorporated by reference herein.

BACKGROUND ART

Recently, in high-frequency applications using a microwave band or a milliwave band as a carrier, for example, in wireless LAN or various communication terminals, reduction in size and thickness of equipment and circuit board has been demanded. In a circuit board for such high-frequency applications, filter elements such as a low-pass filter (LPF), a high-pass filter (HPF) and a band-pass filter (BPF) are designed with a distributed constant, for example, using a microstrip line or a strip line that enables relatively high space-saving, instead of using a lumped constant design using chip components like an inductor and a capacitor.

For example, a circuit board 100 shown in FIG. 1 has a BPF 101 of a flat structure, as a filter element designed with a distributed constant. In this circuit board 100, conductor patterns 103 made of copper or nickel plated with gold are formed as microstrip lines on a dielectric board 102 such as a printed board or a ceramic board, thus constituting the BPF 101. On the entire back side of the dielectric board 102, a ground part (not shown) is formed.

With such a BPF 101, it is possible to selectively transmit a signal of a desired frequency band by optimizing the shape of the conductor patterns 103. Since this BPF 101 is a part of the whole pattern wiring formed on the dielectric board 102 and has a flat structure, the BPF 101 can be collectively formed when forming the pattern wiring on the dielectric board 102, for example, by print processing, lithography processing or the like.

In the circuit board 100 shown in FIG. 1, since the BPF 101 has a flat structure and the conductor patterns 103 are arrayed with an overlap of substantially ¼ of a passing wavelength λ, the length of the conductor patterns 103 is prescribed by the passing wavelength λ. In the circuit board 100, the conductor patterns 103 need to have a certain length and it is difficult to reduce the occupied area of the conductor patterns 103. Therefore, area-saving is limited.

Thus, in a circuit board 100 shown in FIGS. 2A to 2D, it is proposed to save the area by using a BPF 111 as a filter element that requires a smaller occupied area. This BPF 111 has a so-called tri-plate structure, which is a three-layer structure in which resonator conductor patterns 114 arranged substantially parallel to each other are formed in an inner layer of a multilayer board 113 such as a multilayer printed board.

Specifically, in the BPF 111, a pair of resonator lines 114 has an impedance step structure in which low-impedance lines (thick lines) 115 and high-impedance lines (thin lines) 116 are connected with each other near a substantially central part in the longitudinal direction, and feeder wirings 117 are connected to parts near substantially central parts of the high-impedance lines 116, respectively, as shown in FIG. 2C. In this BPF 111, the pair of resonator lines 114 is held between two ground parts 118a, 118b as ground conductors from above and below, with insulating layers 112 provided between the resonator lines 114 and the ground parts 118a, 118b. In this BPF 111, the two ground parts 118a, 118b are connected with each other in the form of interlayer connection by via-holes 119 surrounding the pair of resonator lines 114, and the resonator lines 114 in the layer are shielded by the ground parts 118a, 118b and the via-holes 119.

In this filter circuit 110, the pair of resonator lines 114 is constructed as lines having a length substantially ¼ of the passing wavelength λ are arranged in parallel and then capacitive-coupled. As the pair of resonator lines 114 has the impedance step structure, the length of the lines arranged in parallel can be made equal to or less than the passing wavelength λ, and the occupied area of the BPF 111 can be reduced to realize miniaturization.

In this filter circuit 110, when the BPF 111 is shown in the form of an equivalent circuit, parallel resonance circuits are capacitive-coupled, as shown in FIG. 3. Specifically, a parallel resonance circuit PR1 including a capacitor C1 and an inductance I1 connected between one of the two resonator lines 114 and the ground parts 118a, 118b, and a parallel resonance circuit PR2 including a capacitor C2 and an inductance I2 connected between the other of the two resonator lines 114 and the ground parts 118a, 118b, are capacitive-coupled via a capacitor C3 generated between the pair of resonator lines 114.

In the above-described filter circuit 110, as the impedance ratio between the low-impedance lines 115 and the high-impedance lines 116 of the pair of resonator lines 114 is increased, the lines arranged in parallel can be reduced. Therefore, the occupied area of the filter element can be reduced to realize miniaturization. Specifically, by forming the high-impedance lines 116 that are much thinner than the low-impedance lines 115, it is possible to further miniaturize the filter circuit 110.

In the filter circuit 110, since metal layers of the above-described resonator lines 114 formed by a thick film forming technique such as a plating method are patterned by etching processing or the like, it is difficult to reduce the thickness of the high-impedance lines 116 to 0.075 mm or less, thus limiting the miniaturization.

In this filter circuit 110, when the thickness of the high-impedance lines 116 of the pair of resonator lines 114 is reduced to the minimum possible level, it is difficult to form the high-impedance lines 116 with high accuracy, and reduction in yield and deterioration in filter characteristic may occur.

DISCLOSURE OF THE INVENTION

It is an object of the present invention to provide a new filter circuit device and a method for manufacturing the same that enable solution to the problem of the conventional filter circuit device as described above.

It is another object of the present invention to provide a filter circuit device in which deterioration in filter characteristic is prevented and in which the occupied area of a filter element is reduced to realize miniaturization, and a method for manufacturing the same.

A filter circuit device according to the present invention includes: a circuit part in which plural circuit layers are stacked, each circuit layer including an insulating layer made of a dielectric insulating material and a wiring layer made of a pattern conductor; and a filter element in which a first filter line and a second filter line, each including a pair of lines parallel to each other provided in a part of the wiring layers of the circuit layers, are formed in different ones of the circuit layers so that the lines of each pair are substantially parallel to each other in their longitudinal direction, the first filter line and the second filter line being electrically connected at one end where they face each other in the direction of stacking of the circuit layers; wherein in the filter element, the first filter line is formed as a high-impedance line having a smaller thickness and a smaller width than the second filter line by a thin film forming technique, and the second filter line is formed as a low-impedance line by a thick film forming technique.

In the filter circuit device according to the present invention, since the first filter line as the high-impedance line of the filter element is formed by the thin film forming technique so as to have a significantly smaller thickness and a significantly smaller width than the second filter line as the low-impedance line formed by the thick film forming technique, the ratio of impedance between the high-impedance line and the low-impedance line can be increased and the length of each pair of lines formed in the wiring layers of the circuit layers can be significantly reduced.

In this filter circuit device, since the high-impedance line of the filter element is formed by the thin film forming technique, a thin line having a smaller thickness and less unevenness in size than when the high-impedance line is formed by the thick film forming technique is formed with high accuracy.

A method for manufacturing a filter circuit device according to the present invention includes: a circuit layer forming step of forming plural circuit layers, each circuit layer including an insulating layer made of a dielectric insulating material and a wiring layer made of a pattern conductor; a first line forming step of forming a first filter line including a pair of lines parallel to each other provided in a part of the wiring layer in one of the plural circuit layers; a second line forming step of forming a second filter line including a pair of lines parallel to each other provided in a part of the wiring layer in another one of the circuit layers that is different from the circuit layer where the first filter line is formed; a circuit part forming step of forming a circuit part by stacking the plural circuit layers; and an element forming step of, when stacking the circuit layers, stacking the first filter line and the second filter line so as to face each other in such a manner that the lines of each pair are substantially parallel to each other in their longitudinal direction, and electrically connecting the first filter line and the second filter line at one end where they face each other in the direction of stacking of the circuit layers, thus forming a filter element. In the method for manufacturing a filter circuit device according to the present invention, at the first line forming step, the first filter line is formed as a high-impedance line having a smaller thickness and a smaller width than the second filter line by a thin film forming technique, and at the second line forming step, the second filter line is formed as a low-impedance line by a thick film forming technique.

In the method for manufacturing a filter circuit device according to the present invention, since the first filter line as the high-impedance line of the filter element is formed by the thin film forming technique so as to have a significantly smaller thickness and a significantly smaller width than the second filter line as the low-impedance line formed by the thick film forming technique, the ratio of impedance between the high-impedance line and the low-impedance line can be increased and the length of each pair of lines constituting the filter element can be significantly reduced. Thus, a further miniaturized filter circuit device can be manufactured.

In this method for manufacturing a filter circuit device, since the high-impedance line of the filter element is formed by the thin film forming technique, the high-impedance line having a smaller thickness and less unevenness in size than when it is formed by the thick film forming technique can be formed with high accuracy. Therefore, a filter circuit device having a filler element in which deterioration in filter characteristic is prevented is manufactured at a high yield.

The other object of the present invention and specific advantages provided by the present invention will be further clarified by the following description of an embodiment referring to the drawings.

BRIEF DESCRIPTION OF THE DRAWINGS

FIG. 1 is a schematic plan view showing a circuit board having a band-pass filter of a flat structure.

FIG. 2A is a partly perspective longitudinal sectional view. FIG. 2B is a plan view showing a ground part of an upper layer. FIG. 2C is a plan view showing resonator lines. FIG. 2D is a plan view showing a ground part of a lower layer.

FIG. 3 is a circuit diagram showing the band-pass filter of the tri-plate structure in the form of an equivalent circuit.

FIG. 4 is a longitudinal sectional view showing the state where a filter circuit device according to the present invention is mounted on a base board.

FIG. 6A is a plan view showing a third ground part. FIG. 6B is a plan view showing a second resonator line. FIG. 6C is a plan view showing a first ground part. FIG. 6D is a plan view showing a first resonator line. FIG. 6E is a plan view showing a second ground part.

FIG. 8 is a longitudinal sectional view showing a core board. FIG. 9 is a longitudinal sectional view showing the state where a first wiring layer and a second wiring layer are formed. FIG. 10 is a longitudinal sectional view showing the state of joining a first resin-attached metal film and a second resin-attached metal film to the core board. FIG. 11 is a longitudinal sectional view showing the sate where a via-hole is formed in the first resin-attached metal film and the second resin-attached metal film. FIG. 12 is a longitudinal sectional view showing a circuit part intermediate body. FIG. 13 is a longitudinal sectional view showing the state of joining a third resin-attached metal film and a fourth resin-attached metal film to the circuit part intermediate body. FIG. 14 is a longitudinal sectional view showing the state where the third resin-attached metal film and the fourth resin-attached metal film are joined to the circuit part intermediate body. FIG. 15 is a longitudinal sectional view showing the first circuit part.

FIG. 17 is a longitudinal sectional view showing the state where a first insulating layer is formed on a forming surface. FIG. 18 is a longitudinal sectional view showing the state where a metal film is formed on the first insulating layer. FIG. 19 is a longitudinal sectional view showing the state where a first conductor layer is formed. FIG. 20 is a longitudinal sectional view showing the state where a via-hole is formed in a first unit wiring layer. FIG. 21 is a longitudinal sectional view showing the state where a second unit wiring layer is formed on the first unit wiring layer. FIG. 22 is a longitudinal sectional view showing the state where a third unit wiring layer is formed on the second unit wiring layer. FIG. 23 is a longitudinal sectional view showing the state where the circuit part is formed on the first circuit part.

BEST MODE FOR CARRYING OUT THE INVENTION

An embodiment of the present invention will now be described in detail with reference to the drawings.

Figure 2A:
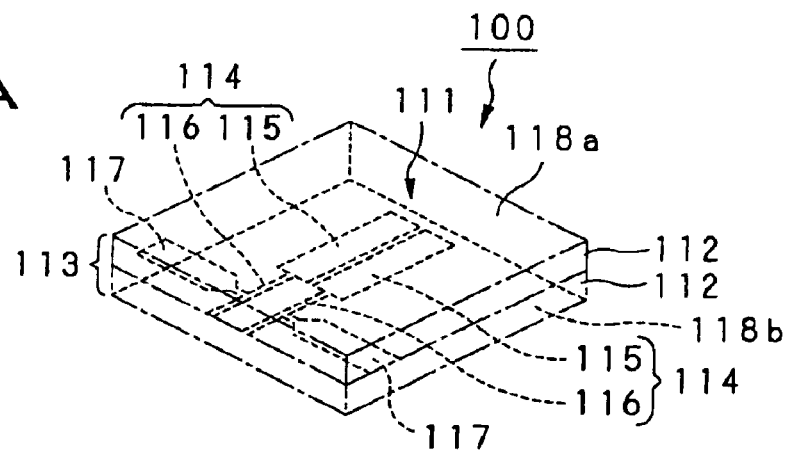
FIGS. 2A to 2D show a filter circuit having a band-pass filter of a tri-plate structure.
Figure 2B:
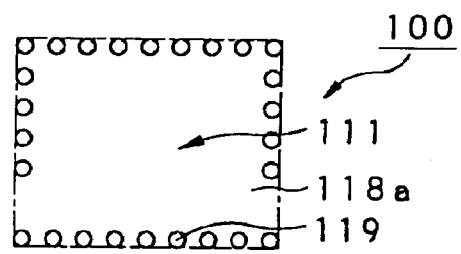
Figure 2C:
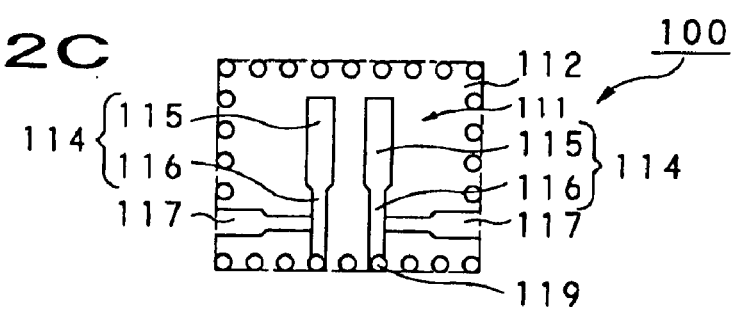
Figure 2D:
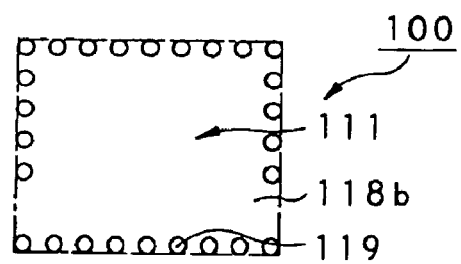
Figure 5:
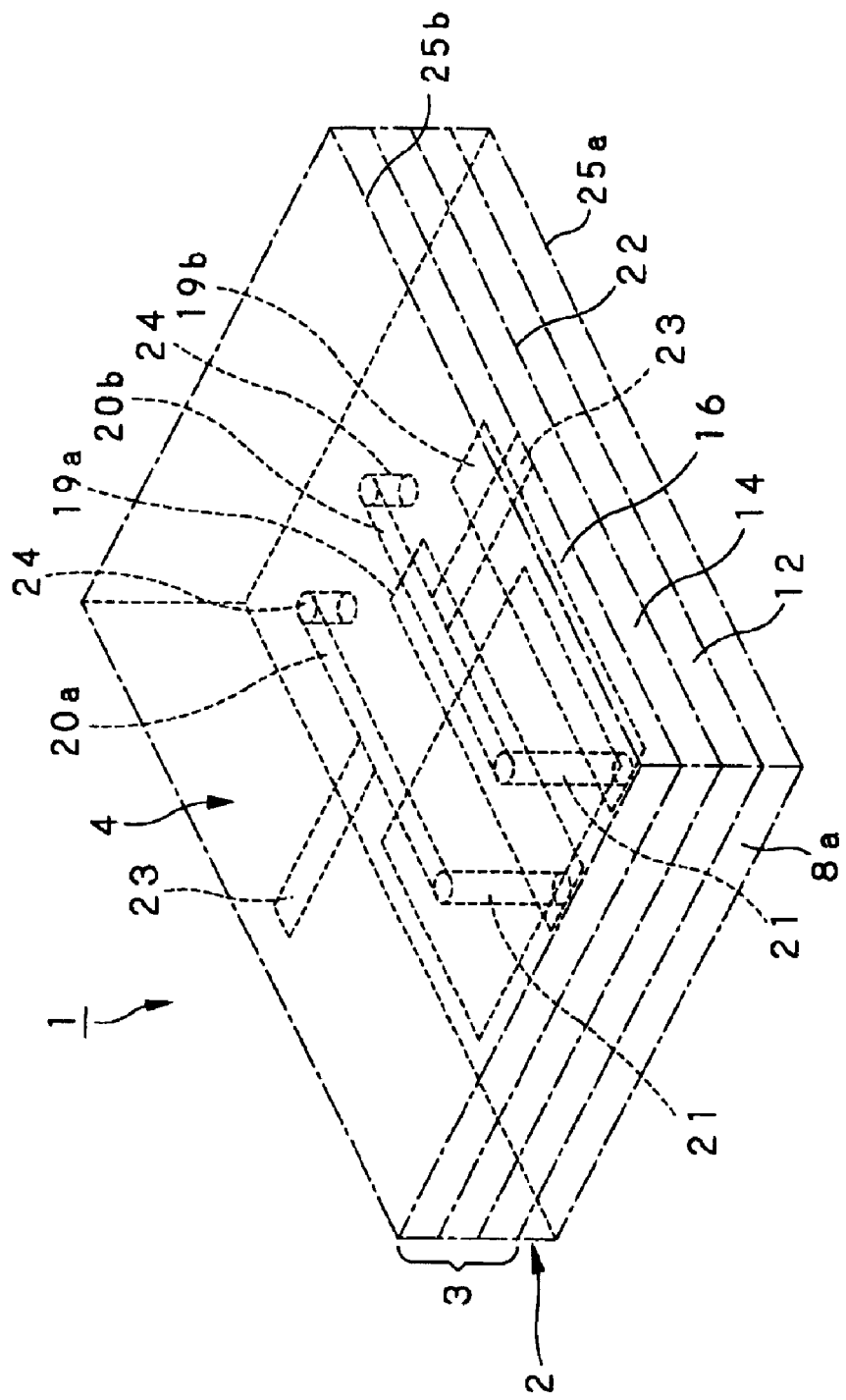
FIG. 5 is a partly perspective view showing a filter element constituting the filter circuit device.

A filter circuit device to which the present invention is applied constitutes a high-frequency circuit used in a transmitting/receiving unit provided in a portable communication terminal device or the like and adapted for processing a high-frequency signal. The filter circuit device 1 has a first circuit part 2, a second circuit part 3 formed on a major surface (hereinafter referred to as forming surface) 2a of the first circuit part 2, and a filter element 4 formed to extend onto the first circuit part 2 and the second circuit part 3, as shown in FIGS. 4 and 5.

In the filter circuit device 1, the first circuit part 2 has a wiring part of a power system and a control system with respect to the second circuit part 3 formed on the forming surface 2a, and a mounting surface 2b with respect to a base board 90. In the filter circuit device 1, a semiconductor component 91 such as a semiconductor chip, an IC (integrated circuit) chip or an LSI (large-scaled integrated circuit) chip is mounted on a mounting surface 3a, which is the surface of the second circuit part 3, and a shield cover 92 is attached to seal the whole mounting surface 3a.

Figure 8:
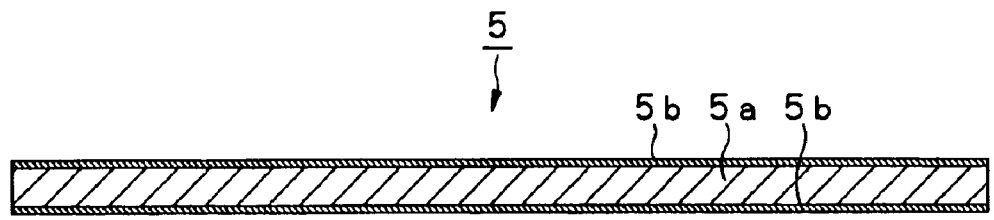
FIGS. 8 to 15 sequentially show the process of manufacturing the first circuit part constituting the filter circuit device.

The first circuit part 2 uses a core board 5 as its core, which is a dual-side board. The core board 5 has a structure in which plural resin layers and wiring layers are stacked on its two major surfaces. In the first circuit part 2, the core board 5 includes a resin layer 5a and metal layers 5b formed on both major surfaces of the resin layer 5a, as shown in FIG. 8, which will be described later. As these metal layers 5b are patterned, for example, by etching processing, one of the metal layers becomes a first wiring layer 6 and the other becomes a second wiring layer 7.

The resin layer 5a constituting the core board 5 is made of a dielectric insulating material having low Tan δ at a low dielectric constant, that is, an excellent high-frequency characteristic. Specifically, the resin layer 5a is made of polyphenylene ether (PPE), bismaleidetriazine (BT-resin), polytetrafluoroethylene, polyimide, liquid crystal polymer (LCP), polynorbornene (PN B), ceramics, or a mixture of ceramics and an organic material. The core board 5 has mechanical rigidity, heat resistance, and chemical resistance. For example, an epoxy-based copper-clad board FR-5 or the like may be used, which is less expensive than the board material made of the above-described materials.

The metal layers 5b provided in the core board 5, that is, the first wiring layer 6 and the second wiring layer 7, are made of highly conductive metal layers such as Cu. These wiring layers are formed on both major surfaces of the resin layer by a thick film forming technique such as a plating method and patterned by etching processing or the like.

In the first circuit part 2, a first resin-attached metal film 8 is joined onto the first wiring layer 6 of the core board 5, and a second resin-attached metal film 9 is joined onto the second wiring layer 7. The first resin-attached metal film 8 includes a resin layer 8a and a metal film 8b. The resin layer 8a is joined to face the first wiring layer 6 of the core board 5, and the metal film 8b is patterned by etching processing or the like, thus forming a third wiring layer 10, which is a pattern conductor. The second resin-attached metal film 9 includes a resin layer 9a and a metal film 9b. The resin layer 9a is joined to face the second wiring layer 7 of the core board 5, and the metal film 9b is patterned by etching processing or the like, thus forming a fourth wiring layer 11, which is a pattern conductor.

The resin layers 8a, 9a of the first resin-attached metal film 8 and the second resin-attached metal film 9 are made of a material having low Tan δ at a low dielectric constant and an excellent high-frequency characteristic, similarly to the resin layer 5a of the core board. The metal layers 8b, 9b constituting first resin-attached metal film 8 and the second resin-attached metal film 9, that is, the third wiring layer 10 and the fourth wiring layer 11, are made of highly conductive Cu layers. These wiring layers are formed on major surfaces of the resin layers 8a, 9b by a thick film forming technique such as a plating method and patterned by etching processing or the like.

In the first circuit part 2, resin-attached metal films, not shown here, are joined onto the third wiring layer 10 of the first resin-attached metal film 8 and the fourth wiring layer 11 of the second resin-attached metal film 9 so that the resin-layer sides of these resin-attached metal films face the wiring layers. These resin-attached metal films are polished until the third wiring layer 10 and the fourth wiring layer 11 are exposed. Thus, in the first circuit part 2, the resin layer is embedded between the pattern conductors of the third wiring layer 10 and the fourth wiring layer 11, and the surface where the third wiring layer 10 and the fourth wiring layer 11 are exposed is flattened with high accuracy.

The first circuit part 2 is constructed as described above. In this description, since the second circuit part 3 is formed on the side of the third wiring layer 10 that is flattened with high accuracy, the surface where the third wiring layer 10 is exposed is regarded as the forming surface 2a. Alternatively, the second circuit part 3 may be formed on the major surface on the side where the fourth wiring layer 11 is exposed, of the first circuit part 2. The major surface opposite to the forming surface 2a, that is, the major surface on the side where the fourth wiring layer 11 is exposed, is regarded as the mounting surface 2b to face and be mounted on the base board 90.

The second circuit part 3 has a structure in which plural resin layers and wiring layers are stacked on the forming surface 2a of the first circuit part 2, which is flattened with high accuracy. Specifically, the second circuit part 3 has a structure in which a first insulating layer 12, a first conductor layer 13, a second insulating layer 14, a second conductor layer 15, a third insulating layer 16 and a third conductor layer 17 are sequentially stacked on the forming surface 2a of the first circuit part 2.

In the second circuit part 3, the plural insulating layers are made of a material having low Tan δ at a low dielectric constant and an excellent high-frequency characteristic, similarly to the resin layer 5a of the core board. In the second circuit part 3, the plural conductor layers, made of highly conductive metal layers such as Cu, are formed between the insulating layers, respectively, by a thin film forming technique such as a sputtering method or a chemical vapor deposition (CVD) method, and are patterned by etching processing or the like. In the second circuit part 3, plural via-holes 18 for electrically connecting the plural conductor layers are provided between these plural conductor layers, and these via-holes 18 connect the plural conductor layers by interlayer connection.

The filter element 4 is designed on the basis of a distributed constant design using a microstrip line or strip line, instead of a lumped constant design using a chip component such as an inductor or a capacitor. In this filter element 4, a pair of first resonator lines (hereinafter referred to as first lines) 19a, 19b provided in a part of the third wiring layer 10 in the first circuit part 2, and a pair of second resonator lines (hereinafter referred to as second lines) 20a, 20b provided in a part of the conductor layer that is second from the forming surface 2a in the second circuit part 3, that is, in a part of the second conductor layer 15, are stacked and these pairs of lines are selectively connected by connecting parts 21 including via-holes or through-holes, as shown in FIG. 5 and FIGS. 6A to 6E.

In the filter element 4, a first ground part 22 provided in a part of the conductor layer that is first from the forming surface 2a in the circuit part 2, that is, in a part of the first conductor layer 13, is provided between the stacked first lines 19a, 19b and second lines 20a, 20b. This first ground part 22 serves as a ground conductor for the second lines 20a, 20b.

Figure 6A:
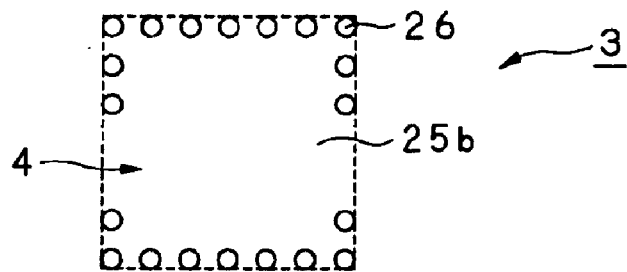
FIGS. 6A to 6E show the filter element provided in the filter circuit device.
Figure 6B:
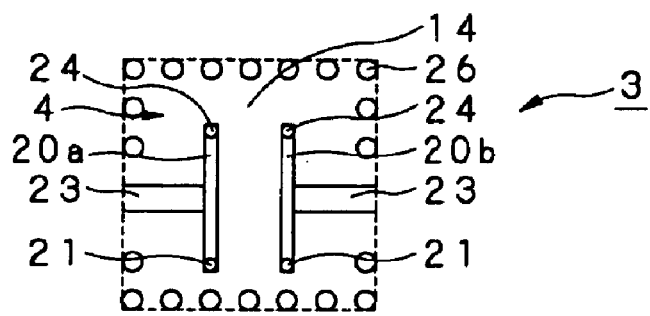
Figure 6C:
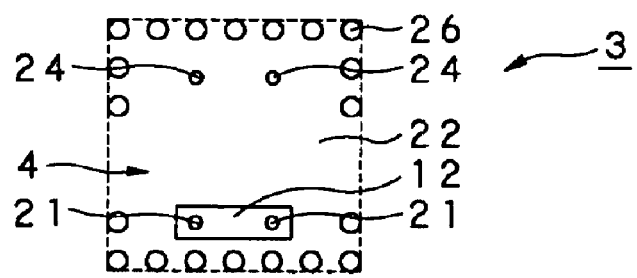
Figure 6D:
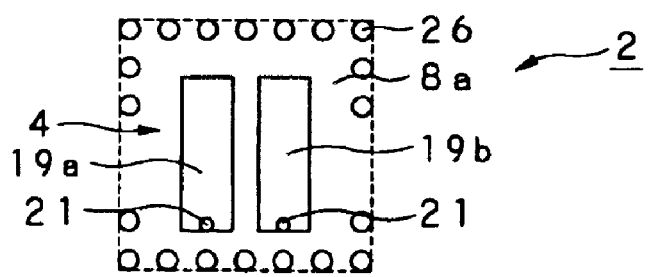
Figure 6E:
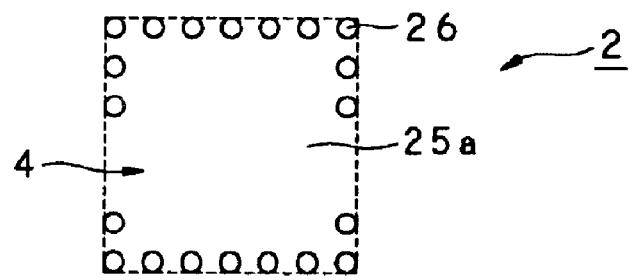

In the filter element 4, the first lines 19a, 19b are linearly formed and arranged substantially parallel to each other so that they face each other in the direction of their width, as shown in FIG. 6D. In the filter element 4, similarly to the first lines 19a, 19b, the second lines 20a, 20b are linearly formed and arranged substantially parallel to each other so that they face each other in the direction of their width, as shown in FIG. 6B. In the filter element 4, the second line 20a is formed right above the first line 19a, and the second line 20b is formed right above the first line 19b. The lines facing each other in the direction of the thickness of the filter circuit device 1 are electrically connected with each other at one end by the connecting parts 21. Specifically, as shown in FIGS. 6B, 6C and 6D, the first line 19a and the second line 20a are connected at one end and the first line 19b and the second line 20b are connected at one end by the connecting parts 21.

In the filter element 4, on the pair of second lines 20a, 20b, feeder parts 23 protruding in the direction opposite to the facing direction of the second lines 20, 20b are provided from substantially central parts in the longitudinal direction of the second lines 20a, 20b, as shown in FIG. 6B. On the second lines 20a, 20b, short-circuit via-holes 24 for connecting to the first ground part 22 are provided at the other end that is opposite to the one end where the second lines 20a, 20b are connected with the connecting parts 21, as shown in FIG. 5.

In the filter element 4, a second ground part 25a is formed right below the first lines 19a, 19b, that is, in a part of the first wiring layer 6 in the first circuit part 2, and a third ground part 25b is formed right above the second lines 20a, 20b, that is, in part of the third conductor layer 17, which is the third conductor layer from the forming surface 2a in the second circuit part 3. In the filter element 4, plural shield parts 26 including via-holes or through-holes for making electric interlayer connection between the first ground part 22, the second ground part 25a and the third ground part 25b are formed around the first lines 19a, 19b and the second lines 20a, 20b. Thus, in the filter element 4, the second ground part 25a, the third ground part 25b and the shield parts 26 shield the first lines 19a, 19b and the second lines 20a, 20b.

Specifically, in the filter element 4, the first lines 19a, 19b are formed as low-impedance lines in a part of the third wiring layer 10 in such a manner that the first lines 19a, 19b have a length of approximately 7 mm, a width of approximately 1 mm and a thickness more than 100 $\mu$m and are exposed from the forming surface 2a of the first circuit part 2 having a dielectric insulating material with a relative dielectric constant of approximately 3.8 and having a thickness of approximately 0.7 mm. In this filter element 4, the second lines 20a, 20b are formed as high-impedance lines in a part of the second conductor layer 15 on the second insulating layer 14 formed by depositing a dielectric insulating material with a relative dielectric constant of approximately 2.65 to a thickness of approximately 20 $\mu$m so that the second lines 20a, 20b have a length of approximately 7 mm, a width of approximately 50 $\mu$m and a thickness less than 50 $\mu$m.

In the filter circuit device 1 of the above-described structure, the pair of second lines 20a, 20b, as the high-impedance lines of the filter element, is formed in a part of the second conductor layer 15 of the second circuit part 3, and this second conductor layer 15 is formed by a thin film forming technique such as a sputtering method or a CVD method. Therefore, in this filter circuit device 1, the pair of second lines 20a, 20b can be accurately formed to have a significantly smaller thickness than that of the pair of first lines 19a, 19b as the low-impedance lines formed by a thick film forming technique such as a plating method.

In this filter circuit device 1, since the impedance ratio between the pair of second lines 20a, 20b accurately formed to have a significantly smaller thickness by the thin film forming technique and the pair of first lines 19a, 19b formed by the thick film forming technique can be increased in the filter element 4, the length of these pairs of resonator lines can be significantly reduced and miniaturization is realized.

In this filter circuit device 1, since the pair of thin second lines 20a, 20b is by the thin film forming technique in the filter element 4, it is possible to accurately form the pair of second lines 20a, 20b having a significantly smaller thickness and less unevenness in thickness than in the case of forming resonator lines by a thick film forming technique such as a plating method. Thus, deterioration in filter characteristic is prevented.

In this filter circuit device 1, the filter element 4 has a structure in which the pair of first lines 19a, 19b and the pair of second lines 20a, 20b are stacked via the dielectric insulating material, with the pairs of lines connected each other at one end in their longitudinal direction by the connecting parts 21, that is, a structure in which a pair of resonator lines is bent at the connecting parts 21 so as to sandwich the dielectric insulating material.

Therefore, in the filter circuit device 1, the length of the first lines 19a, 19b and the second lines 20a, 20b in the filter element 4 can be reduced to half the length of a pair of resonator lines where the resonator lines used for the same frequency band as the filter element 4 are formed in a planar form. It is therefore possible to reduce the occupied area of the filter element 4 and realize miniaturization.

In this filter circuit device 1, since the pair of second lines 20a, 20b as high-impedance lines of the filter element 4 is provided on the second insulating layer 14 made of the dielectric insulating material having a lower relative dielectric constant than that of the first circuit part 2 where the pair of first lines 19a, 19b as low-impedance lines is formed, the length of these pairs of resonator lines can be further reduced.

In this filter circuit device 1, the first ground part 22 is provided between the layers where the pair of first lines 19a, 19b and the pair of second lines 20a, 20b are formed, in the filter element 4, and the first ground part 22 functions as a shield between the pair of first lines 19a, 19b and the pair of second lines 20a, 20b. Therefore, deterioration in filter characteristic due to interference between the pairs of resonator conductors is prevented.

A method for manufacturing the above-described filter circuit device will now be described.

To manufacture the filter circuit device 1, the first circuit part 2 is formed first. The process of preparing the first circuit part 2 will be described with reference to FIGS. 7 to 15.

Figure 7:
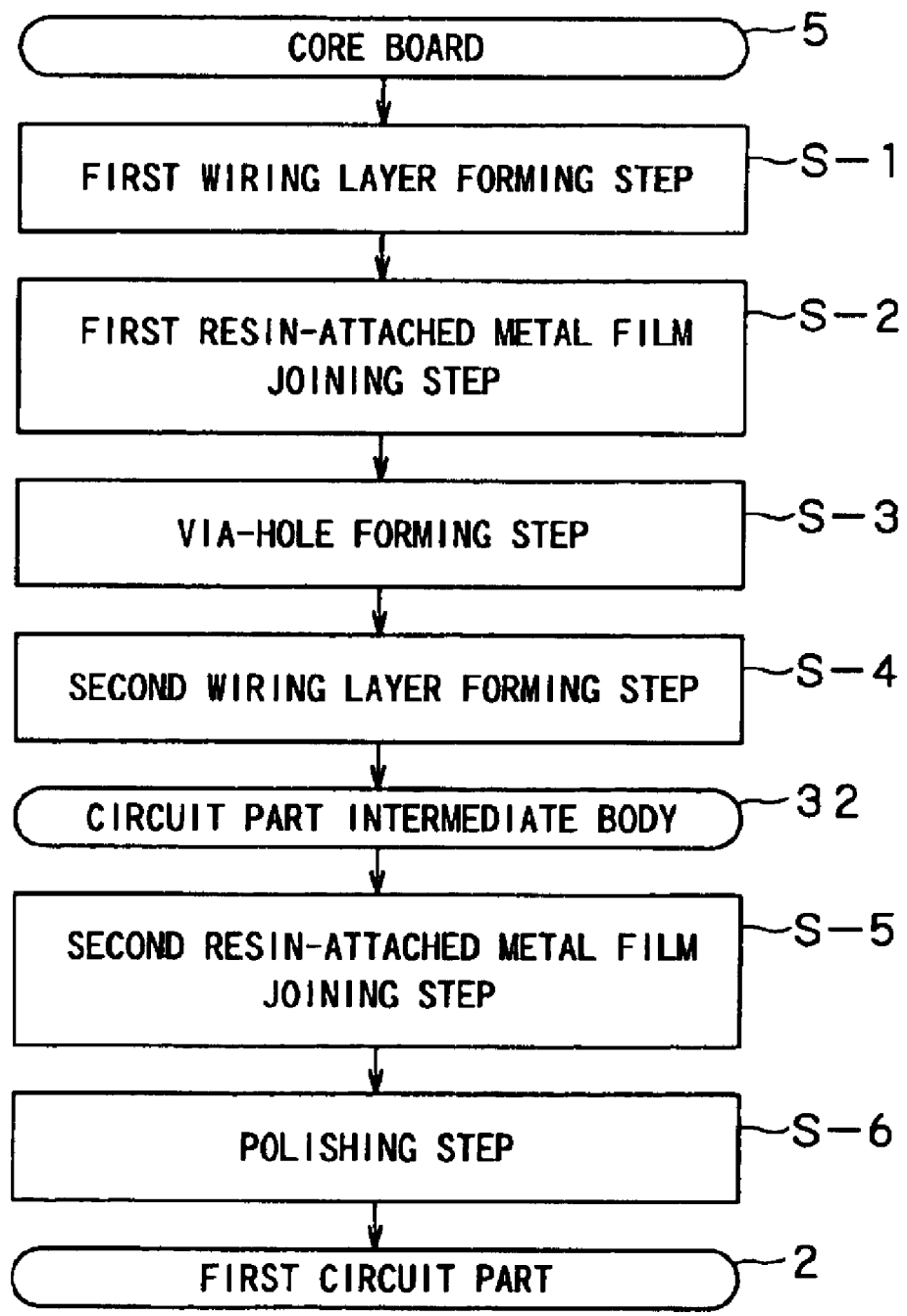
FIG. 7 is a process view showing a process of manufacturing a first circuit part constituting the filter circuit device.

In the first circuit part preparation process, as shown in FIG. 7, a circuit part intermediate body 32 is prepared through the following steps: a first wiring layer forming step s-1 of forming plural via-holes 30 in the front and back major surfaces of the core board 5, penetrating the first wiring layer 6, the second wiring layer 7 and the core board 5; a first resin-attached metal film joining step s-2 of joining the first resin-attached metal film 8 and the second resin-attached metal film 9 to the front and back major surfaces of the core board 5; a via-hole forming step s-3 of forming via-holes 31 in the resin-attached metal films 8 and 9; and a second wiring layer forming step s-4 of forming the third wiring layer 10 in the metal layer 8b of the first resin-attached metal film 8 and forming the fourth wiring layer 11 in the metal layer 9b of the second resin-attached metal film 9.

In the first circuit part preparation process, the first circuit part 2 is prepared through the following steps: a second resin-attached metal film joining step s-5 of joining a third resin-attached metal film 33 covering the third wiring layer 10 and a fourth resin-attached metal film 34 covering the fourth wiring layer 11 to the circuit part intermediate body 32; and a polishing step s-6 of polishing the third resin-attached metal film 33 and the fourth resin-attached metal film 34 to form the forming surface 2a where the third wiring layer 10 is exposed.

When preparing the first circuit part 2 by the above-described process, the core board 5 is prepared in which the metal layer 5b made of a highly conductive metal layer such as Cu is formed on the front and back major surfaces of the resin layer 5a by a plating method or the like, as shown in FIG. 8. The resin layer 5a of the core board 5 is made of a dielectric insulating material having an excellent high-frequency characteristic.

Figure 9:
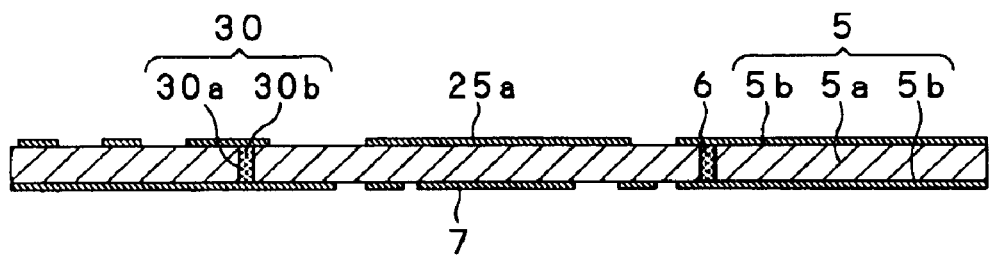

Next, the first wiring layer forming step s-1 is performed on the core board 5, as shown in FIG. 9. In the core board 5, hole-making processing with a drill, laser or the like is performed to form plural via-holes 30a. After the inner walls of these via-holes 30a are, for example, plated and conductive paste 30 is embedded therein, cover forming based on plating or the like is performed. Thus, the via-holes 30 for electrically connecting the metal layers 5b formed on the front and back major surfaces of the resin layer 5a are formed. Since the apertures of the via-holes 30a are covered by plating or the like after the conductive paste 30b is embedded in the via-holes 30a, via-holes or the like can be formed immediately above the via-holes 30.

As photolithography processing or the like is performed on the metal layers 5b formed on the front and back major surfaces of the resin layer 5a of the core board 5, the metal layers 5b are patterned to form the first wiring layer 6 and the second wiring layer 7 as pattern conductors on the front and back major surfaces on the resin layer 5a. At the first wiring layer forming step s-1, the second ground part 25a in the filter element 4 is formed together with the other pattern conductors in the first wiring layer 6.

Figure 10:
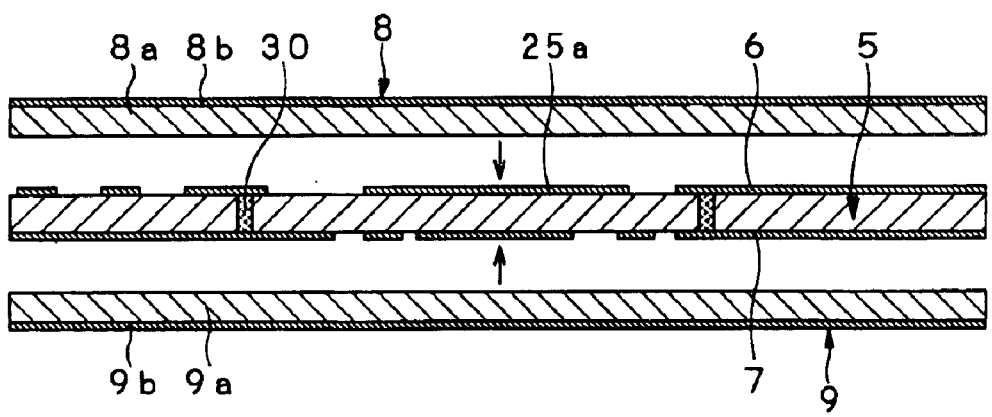

Next, the first resin-attached metal film joining step s-2 is performed on the core board 5, as shown in FIG. 10. To the core board 5, the first resin-attached metal film 8 is joined to cover the first wiring layer 6 and the second resin-attached metal film 9 is joined to cover the second wiring layer 7. In the first resin-attached metal film 8 and the second resin-attached metal film 9, the metal films 8b, 9b made of a highly conductive metal such as Cu are formed by plating or the like on the entire one-side major surfaces of the resin layers 8a, 9a made of a dielectric insulating material having an excellent high-frequency characteristic. The first resin-attached metal film 8 and the second resin-attached metal film 9 are joined onto the first wiring layer 6 and the second wiring layer 7 of the core board 5, for example, by an adhesive resin or a so-called prepreg resin. The first resin-attached metal film 8 and the second resin-attached metal film 9 can be joined without using a prepreg resin, if the resin layers 8a, 9a are made of a thermoplastic resin.

Figure 11:
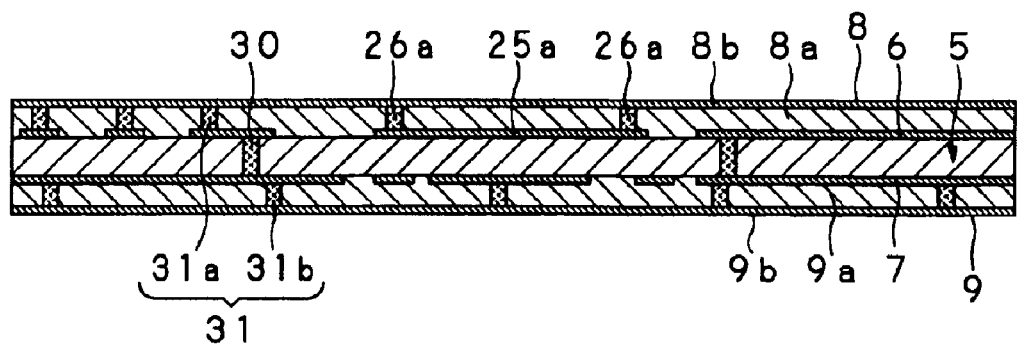

Next, the via-hole forming step s-3 is performed on the first resin-attached metal film 8 and the second resin-attached metal film 9, as shown in FIG. 11. In the first resin-attached metal film 8 and the second resin-attached metal film 9, the via-holes 31 are formed, similarly to the via-holes 30 penetrating the core board 5. Specifically, a via-hole 31a for electrically connecting the first wiring layer 6 with the metal film 8b of the first resin-attached metal film 8 is formed in the first resin-attached metal film 8, and a via-hole 31b for electrically connecting the second wiring layer 7 with the metal film 9b of the second resin-attached metal film 9 is formed in the second resin-attached metal film 9. At the via-hole forming step s-3, a shield via-holes 26a is formed in the first resin-attached metal film 8, similarly to the via-hole 31a, as a pair of the shield part 26 to surround the region where the filter element 4 is formed.

Figure 12:
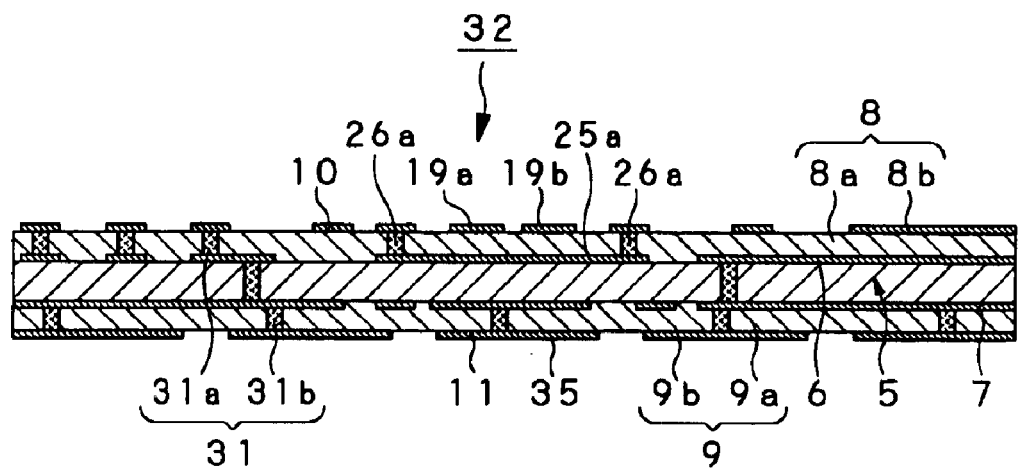

Next, the second wiring layer forming step s-4 is performed on the first resin-attached metal film 8 and the second resin-attached metal film 9, as shown in FIG. 12. In the first resin-attached metal film 8 and the second resin-attached metal film 9, the third wiring layer 10 and the fourth wiring layer 11 are formed by a process similar to the process of forming the first wiring layer 6 and the second wiring layer 7. Specifically, as photolithography processing or the like is performed on the metal films 8b, 9b, the metal films 8b, 9b are patterned, thus forming the third wiring layer 10 as a pattern conductor on the resin layer 8a of the first resin-attached metal film 8 and forming the fourth wiring layer 11 as a pattern conductor on the resin layer 9a of the second resin-attached metal film 9.

At the second wiring layer forming step s-4, in the third wiring layer 10, the pair of first lines 19a, 19b is formed together with the other pattern conductors, immediately above the second ground part 25a provided in a part of the first wiring layer 6. Since the pair of first lines 19a, 19b is provided in a part of the third wiring layer 10 formed by a thick film forming technique such as a plating method, the pair of first lines 19a, 19b has a thickness more than 100 μm. The fourth wiring layer 11 becomes a power supply part from a mother board or an input/output terminal part 35 functioning as an input/output part for electric signals, when the filter circuit device 1 is mounted on the base board 90.

Figure 13:
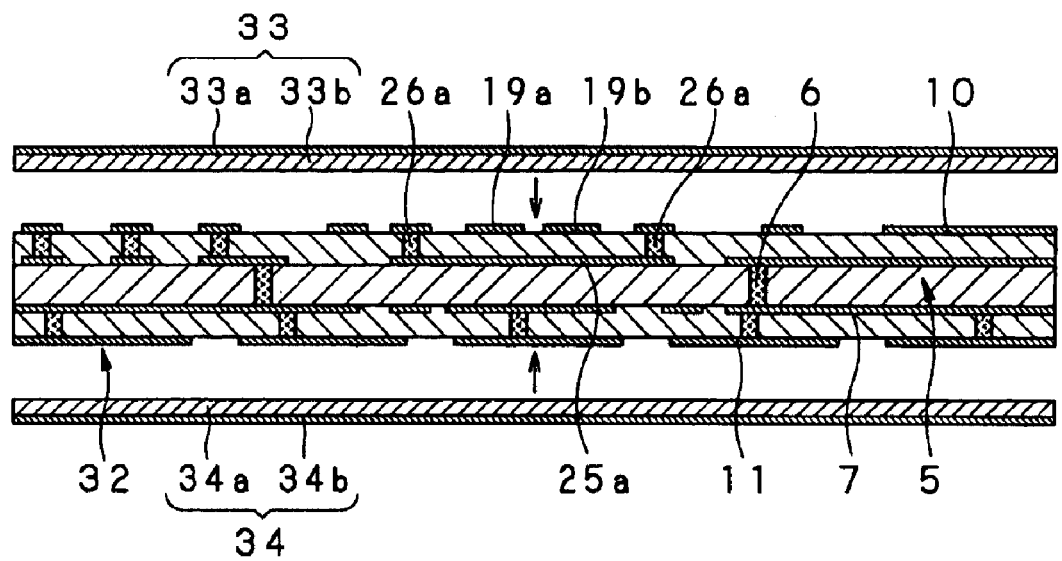
Figure 14:
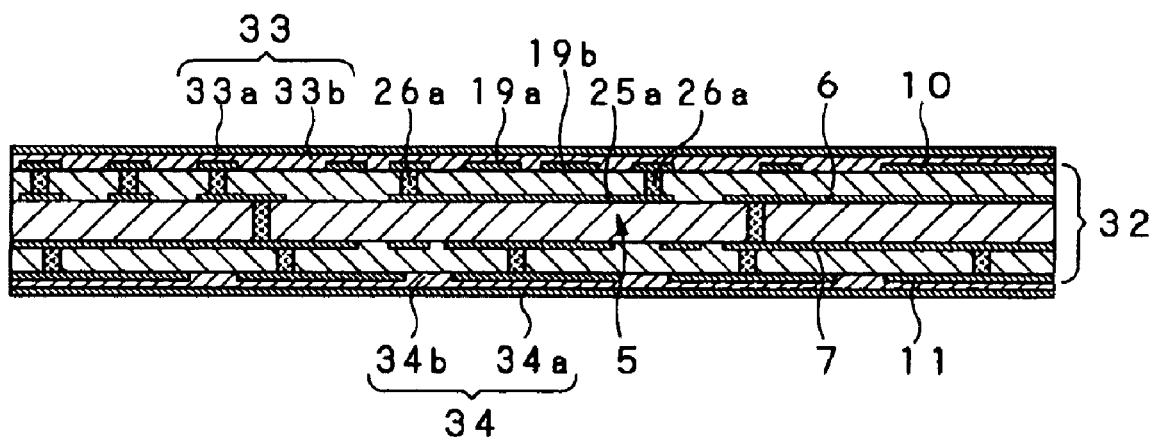

Next, the second resin-attached metal film joining step s-5 is performed on the circuit part intermediate body 32, as shown in FIGS. 13 and 14. To the circuit part intermediate body 32, the third resin-attached metal film 33 is joined to cover the third wiring layer 10 and the fourth resin-attached metal film 34 is joined to cover the fourth wiring layer 11. In the third resin-attached metal film 33 and the fourth resin-attached metal film 34, similar to the above-described resin-attached metal films, metal films 33a, 34a made of a highly conductive metal such as Cu are formed by plating or the like on entire one-side major surfaces of resin layers 33b, 34b made of a dielectric insulating material having an excellent high-frequency characteristic.

The third resin-attached metal film 33 and the fourth resin-attached metal film 34 are joined to both major surfaces of the circuit part intermediate body 32 by prepreg resins on the third wiring layer 10 and the fourth wiring layer 11. The third resin-attached metal film 33 and the fourth resin-attached metal film 34 can be joined without using the prepreg resins, if the resin layers 33b, 34b are made of a thermoplastic resin.

Figure 15:
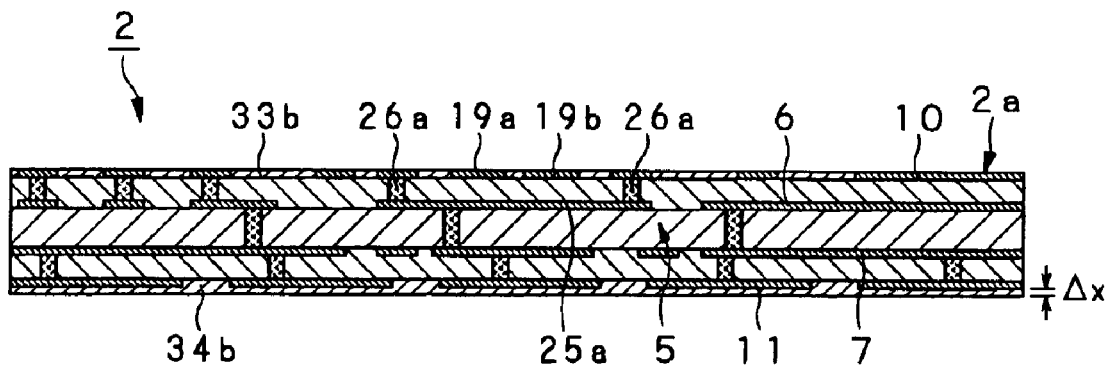

Next, the polishing step s-6 is performed on the third resin-attached metal film 33 and the fourth resin-attached metal film 34, as shown in FIG. 15. The entire major surfaces where the metal films 33a, 34a exist, of the third resin-attached metal film 33 and the fourth resin-attached metal film 34, are polished by a polisher made of, for example, a mixture of alumina and silica.

Specifically, polishing is performed on the third resin-attached metal film 33 until the third wiring layer 10 is exposed. On the fourth resin-attached metal film 34, polishing is performed in such a manner as to leave the resin layer 34b to a predetermined thickness of Δx without exposing the fourth wiring layer 11. Thus, on the surface where the third wiring layer 10 is exposed, the resin layer 33b is embedded between the pattern conductors, forming the forming surface 2a that is flattened with high accuracy. In the above-described manner, the first circuit part 2 is prepared in which the first lines 19a, 19b of the filter element 4 are formed on the forming surface 2a. In this first circuit part 2, a dielectric insulating material having a relatively high relative dielectric constant of approximately 3.8 is used for each resin layer.

In this first circuit part 2, the second circuit part 3 is to be formed on the third wiring layer 10 in a second circuit part preparation process, which will be described later. Since the second circuit part 3 protects the third wiring layer 10 from chemical, mechanical and thermal loads, the resin layer 33b is polished until the third wiring layer 10 is exposed. In the first circuit part 2 of the above-described structure, the third wiring layer 10 constitutes a wiring part for a power system, a wiring part for a control system or a ground part with respect to the second circuit part 3 in the second circuit part preparation process, which will be described later.

In the first circuit part 2 of the above-described structure, the fourth wiring layer 11 is protected by the remaining resin layer 34b from chemical, mechanical and thermal loads in the second circuit part preparation process, which will be described later. In the first circuit part 2, as the above-described resin layer 34b is cut and removed after the second circuit part 3 is formed, the fourth wiring layer 11 is exposed to constitute the input/output terminal part 35.

In the above-described first circuit part preparation process, since a process similar to a conventional process of preparing a multilayer board is used as the process of preparing the circuit part intermediate body 32, the multi-layer board preparation process can be used as it is and high productivity is realized. The first circuit part preparation process is not limited to the above-described process and various conventional multilayer board preparation processes may be used.

Figure 16:
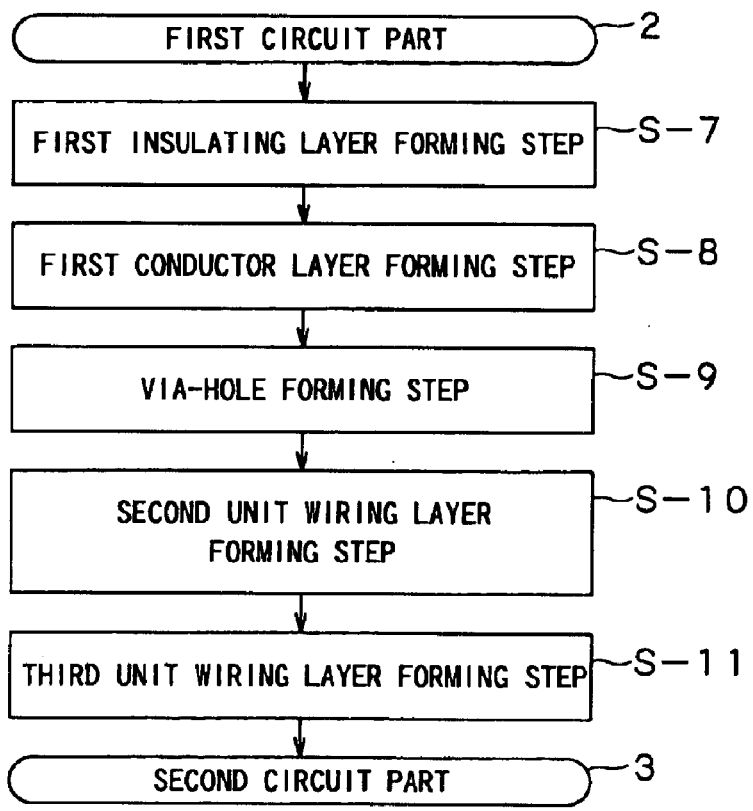
FIG. 16 is a process view showing a process of manufacturing a second circuit part constituting the filter circuit device.

The process of preparing the second circuit part 3 will now be described in detail with reference to FIGS. 16 to 22. As shown in FIG. 16, the second circuit preparation process includes the following steps: a first insulating layer forming step s-7 of forming the first insulating layer 12 on the forming surface 2a of the first circuit part 2; a first conductor layer forming step s-8 of forming the first conductor layer 13 on the surface of the first insulating layer 12; and a via-hole forming step s-9 of forming the via-holes 18 in a first unit wiring layer 36 including the first insulating layer 12 and the first conductor layer 13.

In the second circuit part preparation process, the second circuit part 3 is prepared through the following steps: a second unit wiring layer forming step s-10 of forming a second unit wiring layer 37 including the second insulating layer 14 and the second conductor layer 15, on the first unit wiring layer 36; and a third unit wiring layer forming step s-11 of forming a third unit wiring layer 38 including the third insulating layer 16 and the third conductor layer 17, on the second unit wiring layer 37.

Figure 17:
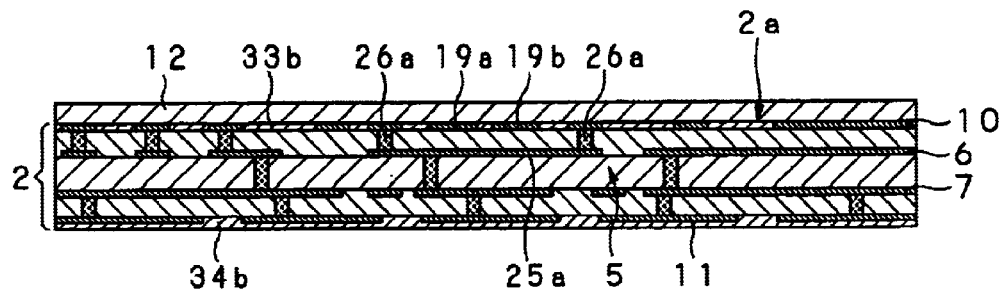
FIGS. 17 to 23 sequentially show the process of manufacturing the second circuit part constituting the filter circuit device.

In preparing the second circuit part 3 by the above-described process, first, the first insulating layer forming step s-7 is performed on the forming surface 2a of the first circuit part 2, as shown in FIG. 17. On the entire forming surface 2a of the first circuit part 2, a dielectric insulating material having low Tan δ at a low dielectric constant and an excellent high-frequency characteristic, and the first insulating layer 12 made of this dielectric insulating material is formed. The dielectric insulating material forming the first insulating layer 12 may be, for example, benzocyclobutene (BCB), polyimide, polynorbornene (PNB), liquid crystal polymer (LCP), epoxy resin, acrylic resin or the like. In this description, the first insulating layer 12 is made of a dielectric insulating material having a low relative dielectric constant of approximately 2.65. The method for forming the first insulating layer 12 may be, for example, a spin coat method, a curtain coat method, a roll coat method, a dip coat method or the like, in which the thickness of the layer to be formed can be controlled relatively easily.

Figure 18:
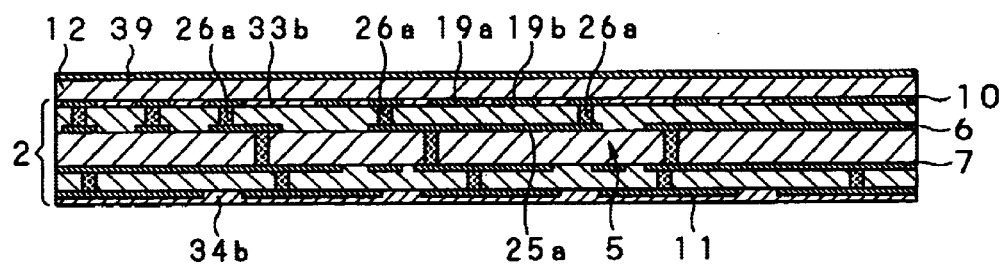

Next, the first conductor layer forming step s-8 is performed on the first insulating layer 12, as shown in FIG. 18. On the entire surface of the first insulating layer 12, a metal film 39 is formed by a thin film forming technique such as a sputtering method or a CVD method. This metal film 39 is made of a highly conductive metal such as Cu with a thickness less than 50 μm.

Figure 19:
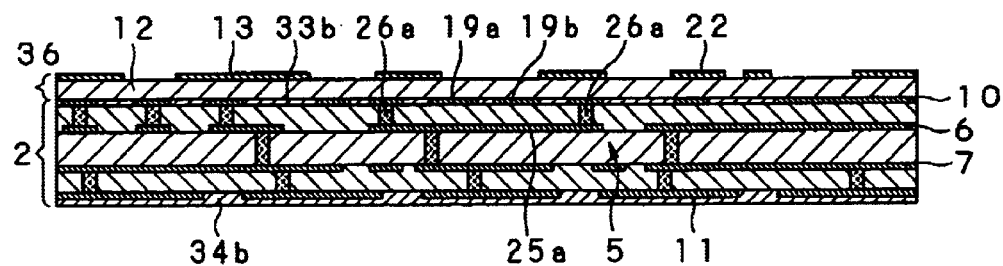

Next, the metal film 39 is patterned, as shown in FIG. 19. The metal film 39 thus becomes the first conductor layer 13. Specifically, as photolithography processing or the like is performed on the metal film 39, the metal film 39 is patterned to form the first conductor layer 13 as a pattern conductor on the first insulating layer 12. At this point, in a part of the first conductor layer 13, the first ground part 22 of the filter element 4 is formed together with the other pattern conductors. In this manner, the first unit wiring layer 36 including the first insulating layer 12 and the first conductor layer 13 is formed.

Figure 20:
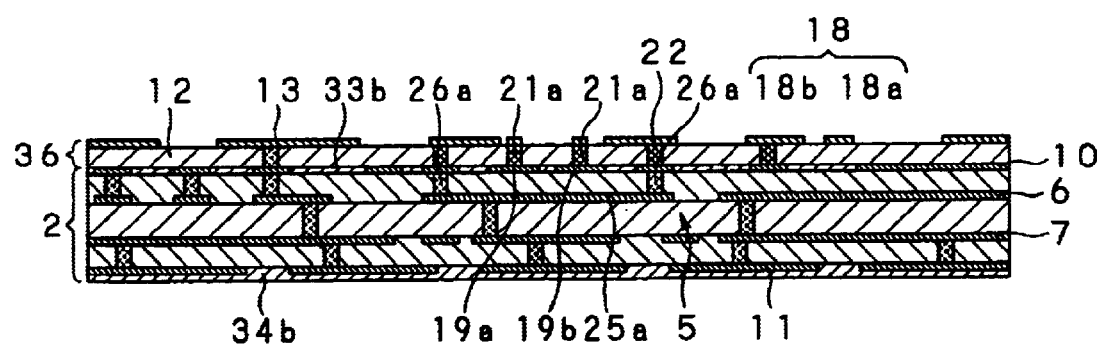

Next, the via-hole forming step s-9 is performed on the first unit wiring layer 36, as shown in FIG. 20. On the first unit wiring layer 36, hole-making processing using a drill, laser or the like is performed and plural via-holes 18a are thus formed. After the inner walls of these via-holes 18a are plated, for example, and conductive paste 18b is embedded therein, cover forming with a metal film is carried out by a sputtering method, a CVD method or the like. The via-holes 18 for electrically connecting to the third wiring layer 10 are thus formed. Since the apertures of the via-holes 18a are covered with a metal film or the like after the conductive paste 18b is embedded in the via-holes 18a, via-holes or the like can be formed immediately above the via-holes 18.

At this via-hole forming step s-9, connection via-holes 21a as a part of the connecting parts 21 of the filter element 4 are formed, similarly to the via-holes 18, in the first unit wiring layer 36 so as to be connected with one end of the pair of first lines 19a, 19b. In the first unit wiring layer 36, plural shield via-holes 26b as a part of the shield part 26 of the filter element 4 are formed, similarly to the via-holes 18, immediately above the shield via-holes 26a.

Figure 21:
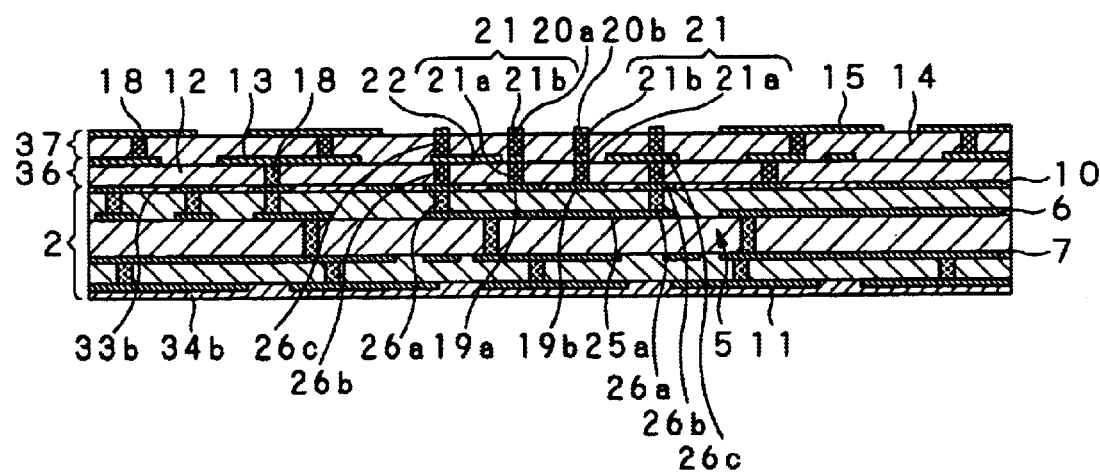

Next, the second unit wiring layer forming step s-10 is performed on the first unit wiring layer 36, as shown in FIG. 21. On the first unit wiring layer 36, the second unit wiring layer 37 including the second insulating layer 14 and the second conductor layer 15 is formed, using materials and processes similar to those of the first insulating layer 12 and the first conductor layer 13. The via-holes 18 are also formed in the second unit wiring layer 37 by a process similar to the via-hole forming step s-9.

At the second unit wiring layer forming step s-10, in the second conductor layer 15, the pair of second lines 20a, 20b is formed together with the other pattern conductors, facing the pair of first lines 19a, 19b provided in a part of the third wiring layer 10. Since the pair of second lines 20a, 20b is provided in a part of the second conductor layer 15 formed by a thin film forming technique such as a sputtering method or a CVD method, the second lines 20a, 20b have a thickness less than 50 $\mu$m.

At the second unit wiring layer forming step s-10, in the second conductor layer 15, the feeder parts 23, not shown in FIG. 21, are formed together with the other pattern conductors, protruding in the direction opposite to the facing direction of the pair of second lines 20a, 20b from substantially central parts in the longitudinal direction of the pair of second lines 20a, 20b.

At the second unit wiring layer forming step s-10, in the second unit wiring layer 37, upper connection via-holes 21b as a part of the connecting parts 21 of the filter element 4 are formed, similarly to the via-holes 18, and connected to one end of the pair of second lines 20a, 20b immediately above the lower connection via-holes 21a formed in the first unit wiring layer 36. In the second unit wiring layer 37, the short-circuit via-holes 24 of the filter element 4, not shown in FIG. 21, are formed, similarly to the via-holes 18, so as to make a short circuit between the other end of the pair of second lines 20a, 20b and the first ground part 22.

In the second unit wiring layer 37, plural shield via-holes 26c as a part of the shield part 26 of the filter element 4 are formed, similarly to the via-holes 18, immediately above the shield via-holes 26b. Thus, the connecting parts 21 include the lower connection via-holes 21a and the upper connection via-holes 21b.

Figure 22:
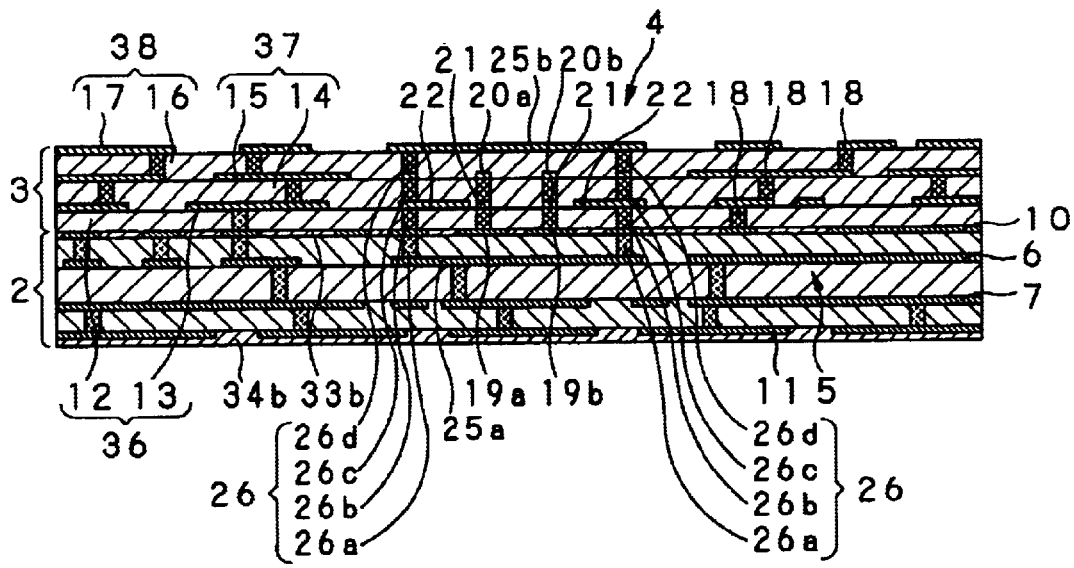

Next, the third unit wiring layer forming step s-11 is performed on the second unit wiring layer 37, as shown in FIG. 22. On the second unit wiring layer 37, the third unit wiring layer 38 including the third insulating layer 16 and the third conductor layer 17 is formed, using materials and processes similar to those of the first insulating layer 12 and the third conductor layer 13. The via-holes 18 are also formed in the third unit wiring layer 38 by a process similar to the via-hole forming step s-9. At the third unit wiring layer forming step s-11, the third ground part 25b of the filter element 4 is formed together with the other pattern conductors in the third conductor layer 17.

At the third unit wiring layer forming step s-11, in the third unit wiring layer 38, plural shield via-holes 26d as a part of the shield part 26 of the filter element 4 are formed, similarly to the via-holes 18, immediately above the shield via-holes 26c. The shield part 26 thus includes the shield via-holes 26a to 26d.

Through the above-described process, the filter element 4 is formed in which the pair of first lines 19a, 19b provided in a part of the third wiring layer 10 of the first circuit part 2 and the pair of second lines 20a, 20b provided in a part of the second conductor layer 15 of the second circuit part 3 are stacked via the dielectric insulating materials. The second circuit part 3 in which the conductor layers as pattern conductors are formed by a thin film forming technique is thus manufactured.

Figure 23:
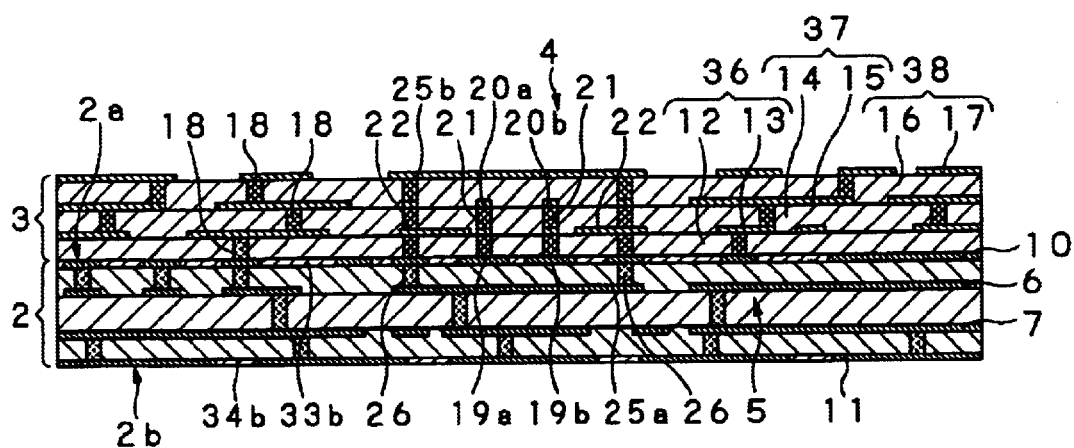

Next, the resin layer 34b exposed on the major surface of the first circuit part 2 that is opposite to the forming surface 2a, that is, on the mounting surface 2b, is polished using a polisher such as a mixture solution of alumina and silica, as shown in FIG. 23. In the first circuit part 2, the fourth wiring layer 11 is thus exposed on the mounting surface 2b.

Figure 24:
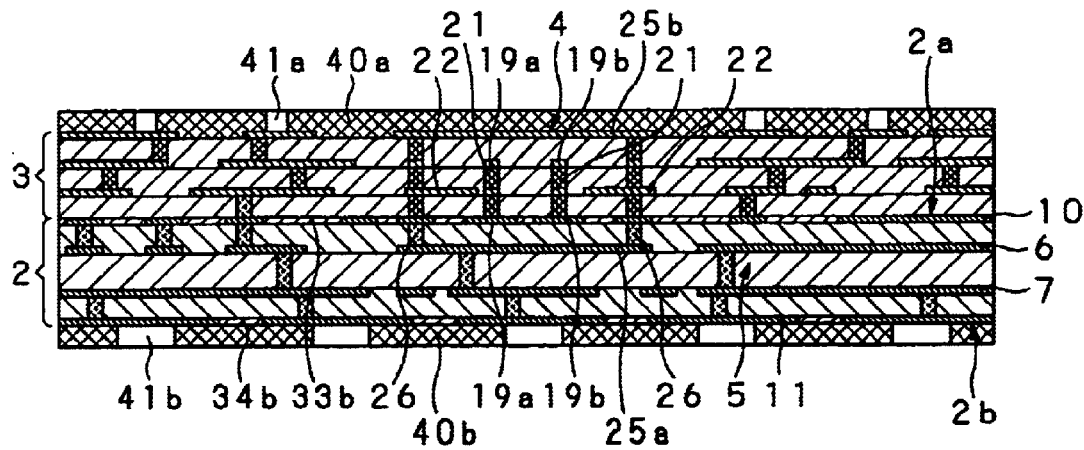
FIG. 24 is a longitudinal sectional view showing a process of manufacturing the filter circuit device according to the present invention and showing the state where a resist layer is formed.
Figure 25:
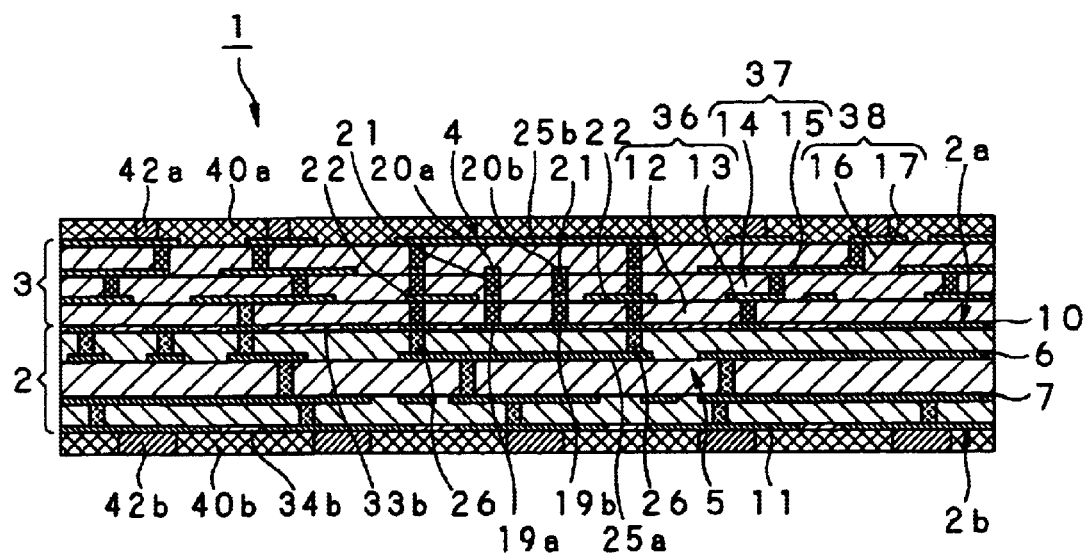
FIG. 25 is a longitudinal section view showing the filter circuit device manufactured by the manufacturing method according to the present invention.

Next, resist layers 40a, 40b are formed on the entire mounting surface 2b of the first circuit part 2 and the entire major surface on the third unit wiring layer side of the second circuit part 3, as shown in FIG. 24. At predetermined positions in the resist layers 40a, 40b, apertures 41a, 41b for exposing the fourth wiring layer 11 and the third conductor layer 17 are provided by a photolithography method or the like. In the apertures 41a, 41b, electrode terminals 42a, 42b made of Au, Ni or the like are formed by a plating method or the like, as shown in FIG. 22. In the above-described manner, the filter circuit device 1 having the filter element 4 extending on the first circuit part 2 and the second circuit part 3 is manufactured.

In the above-described method for manufacturing the filter circuit device 1, the pair of second lines 20a, 20b as the high-impedance lines of the filler element 4 is formed in a part of the second conductor layer 15 of the second circuit part 3, and the second conductor layer 15 is formed by a thin film forming technique such as a sputtering method or a CVD method. Therefore, in this method for manufacturing the filter circuit device 1, the pair of second lines 20a, 20b can be accurately formed to have a significantly smaller thickness than that of the pair of first lines 19a, 19b as the low-impedance lines formed by a thick film forming technique such as a plating method.

In the method for manufacturing the filter circuit device 1 according to the present invention, since the impedance ratio between the pair of second lines 20a, 20b accurately formed to have a significantly reduced thickness by the thin film forming technique and the pair of first lines 19a, 19b formed by the thick film forming technique can be increased in the filter element 4, the filter circuit device 1 that is miniaturized by significantly reducing the length of these pairs of resonator lines can be provided.

In the method for manufacturing the filter circuit device 1, since the pair of second lines 20a, 20b in the filter element 4 is formed to have a significantly reduced thickness by the thin film forming technique, the pair of second lines 20a, 20b having a significantly reduced thickness and restrained unevenness in thickness can be accurately formed, in comparison with the case of forming resonator lines by a thick film forming technique such as a plating method. Thus, the filter circuit device 1 having the filter element 4 in which deterioration in filter characteristic is prevented can be manufactured at a high yield.

The method for manufacturing the filter circuit device 1 provides the filter circuit device 1 having the filter element 4 of a structure in which the pair of first lines 19a, 19b and the pair of second lines 20a, 20b are stacked via the dielectric insulating material and these pairs of lines are connected at one end in their longitudinal direction by the connecting parts 21, that is, a structure in which a pair of resonator lines is bent at the connecting parts 21 so as to sandwich the dielectric insulating material.

Therefore, in the method for manufacturing the filter circuit device 1 according to the present invention, since the length of the first lines 19a, 19b and the second liens 20a, 20b in the filter element 4 can be reduced to not more than half the length of resonator lines in the case where a pair of resonator lines used for the same frequency band as the filter element 4 are formed in a planar form, the filter circuit device 1 that is miniaturized by reducing the occupied area of the filter element 4 is provided.

In the method for manufacturing the filter circuit device 1, since the pair of second lines 20a, 20b as the high-impedance lines of the filter element 4 is formed on the second insulating layer 14 made of a dielectric insulating material having a lower relative dielectric constant than in the first circuit part 2 where the pair of first lines 19a, 19b as the low-impedance lines is formed, these pairs of resonator lines can be further reduced.

In the method for manufacturing the filter circuit device 1, the first ground part 22 of the filter element 4 is formed between the layers of the pair of lines 19a, 19b and the pair of lines 20a, 20b, and the first ground part 22 functions as a shield between the pair of first lines 19a, 19b and the pair of second lines 20a, 20b. Therefore, there is provided the filter circuit device 1 having the filter element 4 in which deterioration in filter characteristic due to interference between these pair of resonator conductor lines is prevented.

Figure 26:
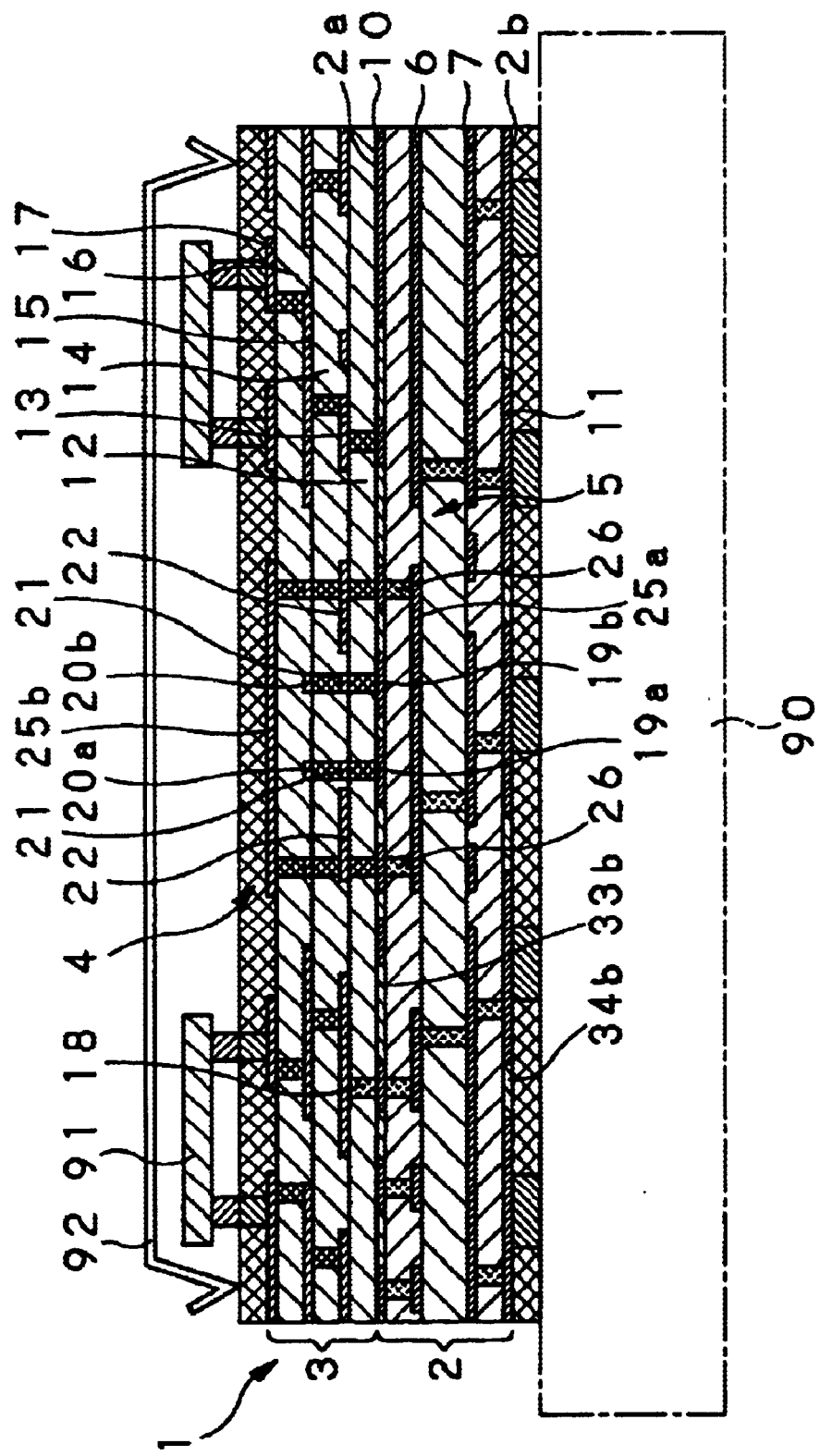
FIG. 26 is a longitudinal sectional view showing the state where the filter circuit device according to the present invention is mounted on a base board.

The above-described filter circuit device 1 is mounted on the base board 90, and the semiconductor components 91 are mounted on the second circuit part 3, for example, by a flip-chip method, as shown in FIG. 26. These semiconductor components 91 cover and protect the shield cover 92. When the filter circuit device 1 is mounted on the base board 90, the electrode terminal 42a formed on the side of the second circuit part 3 constitutes a connecting terminal to be connected to the semiconductor component 91. When the filter circuit device 1 is mounted on the base board 90, the electrode terminal 42b electrically connected to the fourth wiring layer 11 exposed on the mounting surface 2b of the first circuit part 2 functions as a connecting terminal to the base board 90.

While the invention has been described in accordance with a certain preferred embodiment thereof illustrated in the accompanying drawings and described in the above description in detail, it should be understood by those ordinarily skilled in the art that the invention is not limited to the embodiment, but various modifications, alternative constructions or equivalents can be implemented without departing from the scope and spirit of the present invention as set forth and defined by the appended claims.

INDUSTRIAL APPLICABILITY

As described above, according to the present invention, the first filter line as the high-impedance line of the filter element is formed by a thin film forming technique, and the thickness and width of the first filter line can be made significantly smaller than those of the low-impedance line formed by a thick film forming technique. Therefore, the impedance ratio between the high-impedance line and the low-impedance line is increased and the length of the pairs of lines constituting the filter element can be significantly reduced, thus realizing further miniaturization.

According to the present invention, since the high-impedance line of the filter element is formed by a thin film forming technique, the thickness and unevenness in thickness can be reduced in comparison with the case where the high-impedance line is formed by a thick film forming technique, and a filter circuit device having a filter element with an excellent filter characteristic can be manufactured at a high yield.

According to the present invention, the filter element having a structure in which the high-impedance line and the low-impedance line are caused to face each other substantially parallel each other via the insulating layer in the stacking direction of the circuit layers, and in which the high-impedance line and the low-impedance line facing each other in the stacking direction of the circuit layers are electrically connected at one end, that is, the filter element having a structure in which a pair of lines is bent at one end via a dielectric insulating material, is formed.

According to the present invention, the length of the pair of lines in the filter element having the structure in which the pair of lines is bent at one end can be reduced to not more than half the length of lines in the case where the pair of lines constituting the filter element are formed in a planar form. Therefore, the occupied area of the filter element can be reduced and the filter circuit device can be miniaturized.

According to the present invention, the high-impedance line of the filter element are formed in the low-dielectric circuit layer including a low-dielectric insulating layer made of a low-dielectric insulating material having a lower dielectric constant than that of the insulating layer constituting the circuit layer having the low-impedance line, and the wiring layer. Therefore, the length of the pair of lines in the filter element can be further reduced.

What is claimed is:

1. A filter circuit device comprising:
  a circuit part in which a plurality of circuit layers are stacked, each circuit layer including an insulating layer made of a dielectric insulating material and a wiring layer made of a pattern conductor; and
  a filter element in which a first set of parallel filter lines and a second set of parallel filter lines, are respectively provided in different ones of the circuit layers so that the two sets of filter lines are substantially parallel to each other in their longitudinal direction, the first filter line set and the second filter line set being electrically connected at one end;
  wherein the first filter line set is formed by a thin film forming technique as a high-impedance line having a smaller thickness and a smaller width than the second filter line set and the second filter line set is formed as a low-impedance line by a thick film forming technique.

2. The filter circuit device as claimed in claim 1, wherein, the first filter line set is formed in a low-dielectric circuit layer including a low-dielectric insulating layer made of a low-dielectric insulating material having a lower dielectric constant than the insulating layer of the circuit layer where the second filter line set is formed.

3. A method for manufacturing a filter circuit device comprising:

- a circuit layer forming step of forming a plurality of circuit layers, each circuit layer including an insulating layer made of a dielectric insulating material and a wiring layer made of a pattern conductor;
- a first line forming step of forming a first filter line including a pair of lines parallel to each other provided in a part of the wiring layer of one of the plurality of circuit layers;
- a second line forming step of forming a second filter line including a pair of lines parallel to each other provided in a part of the wiring layer of another one of the circuit layers different from the circuit layer where the first filter line is formed;
- a circuit part forming step of forming a circuit part by stacking the plurality of circuit layers; and
- a filter element forming step of, when stacking the plurality of circuit layers, stacking the first filter line and the second filter line so as to face each other in such a manner that the lines of each pair are substantially parallel to each other in their longitudinal direction, and electrically connecting the first filter line and the second filter line at one end;

wherein at the first line forming step, the first filter line is formed by a thin film forming technique as a high-impedance line having a smaller thickness and a smaller width than the second filter line, and at the second line forming step, the second filter line is formed as a low-impedance line by a thick film forming technique.

4. The method for manufacturing a filter circuit device as claimed in claim 3, wherein at the first line forming step, the first filter line is formed in a low-dielectric circuit layer including a low-dielectric insulating layer made of a low-dielectric insulating material having a lower dielectric constant than the insulating layer of the circuit layer where the second filter line is formed.

* * * * *